(12) United States Patent
Chen et al.

(10) Patent No.: US 9,851,398 B2
(45) Date of Patent: Dec. 26, 2017

(54) VIA LEAKAGE AND BREAKDOWN TESTING

(71) Applicant: GLOBALFOUNDRIES INC., Grand Cayman (KY)

(72) Inventors: Fen Chen, Williston, VT (US); Roger A. Dufresne, Fairfax, VT (US); Charles W. Griffin, Jericho, VT (US); Kevin W. Kolvenbach, Walden, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 155 days.

(21) Appl. No.: 14/673,185

(22) Filed: Mar. 30, 2015

(65) Prior Publication Data

US 2016/0291084 A1    Oct. 6, 2016

(51) Int. Cl.
*G01R 31/28* (2006.01)
*H01L 23/522* (2006.01)

(52) U.S. Cl.
CPC ..... *G01R 31/2884* (2013.01); *G01R 31/2831* (2013.01); *H01L 23/5226* (2013.01); *G01R 31/2886* (2013.01)

(58) Field of Classification Search
CPC ............ G01R 31/2889; G01R 31/2891; G01R 31/2884; G01R 31/2886; G01R 1/06794
USPC ....................................................... 324/754.1
See application file for complete search history.

(56) References Cited

U.S. PATENT DOCUMENTS

| 6,842,028 B2* | 1/2005 | Song | G01R 31/2853 324/537 |
| 7,863,106 B2* | 1/2011 | Christo | H01L 21/6835 257/685 |
| 7,898,274 B2* | 3/2011 | Wu | G01R 1/06772 324/754.1 |
| 7,977,962 B2* | 7/2011 | Hargan | G01R 31/2853 324/762.01 |
| 8,252,680 B2 | 8/2012 | Lavoie | |
| 8,329,573 B2 | 12/2012 | Viswanadam | |

(Continued)

FOREIGN PATENT DOCUMENTS

| CN | 201248167 Y | 5/2009 |
| EP | 1689579 A1 | 8/2006 |

(Continued)

OTHER PUBLICATIONS

Examination Report from the Intellectual Property Office dated Apr. 5, 2017 for TW Patent Application No. 105101832; pp. 7.

*Primary Examiner* — Jermele M Hollington
*Assistant Examiner* — Christopher McAndrew
(74) *Attorney, Agent, or Firm* — David Cain; Hoffman Warnick LLC

(57) ABSTRACT

Various particular embodiments include a via testing structure, including: a first terminal coupled to a first set of sensing lines in a top level of the structure; a second terminal coupled to a second set of sensing lines in the top level of the structure, wherein first set of sensing lines and the second set of sensing lines are disposed in a comb arrangement; a third terminal coupled to a third set of sensing lines in a bottom level of the structure; and a plurality of vias electrically coupling the second set of sensing lines in the top level of the structure to the third set of sensing lines in the bottom level of the structure, each via having a via top and a via bottom.

18 Claims, 11 Drawing Sheets

(56) References Cited

U.S. PATENT DOCUMENTS

| | | | |
|---|---|---|---|
| 8,593,170 B2* | 11/2013 | Van der Plas | G01B 31/31851 |
| | | | 324/762.03 |
| 8,637,849 B2 | 1/2014 | Deligianni et al. | |
| 8,698,258 B2 | 4/2014 | Nagarkar et al. | |
| 8,802,475 B2 | 8/2014 | Nagarkar et al. | |
| 8,847,619 B2* | 9/2014 | Hargan | G01R 31/2853 |
| | | | 324/762.01 |
| 2004/0189338 A1* | 9/2004 | Song | G01R 31/2853 |
| | | | 324/750.3 |
| 2007/0164763 A1* | 7/2007 | Park | G01R 31/046 |
| | | | 324/754.1 |
| 2013/0082376 A1 | 4/2013 | Nagarkar et al. | |
| 2014/0170811 A1 | 6/2014 | Nagarkar et al. | |
| 2014/0300574 A1* | 10/2014 | Benkley, III | G06K 9/00013 |
| | | | 345/174 |
| 2014/0306322 A1 | 10/2014 | Edwards et al. | |
| 2014/0339558 A1 | 11/2014 | Chen et al. | |
| 2014/0361395 A1* | 12/2014 | Bhagavat | H01L 27/14634 |
| | | | 257/448 |

FOREIGN PATENT DOCUMENTS

| | | |
|---|---|---|
| EP | 2575164 A2 | 3/2013 |
| TW | 201326826 A | 7/2013 |

* cited by examiner

VIA LEAKAGE AND BREAKDOWN TESTING

TECHNICAL FIELD

The subject matter disclosed herein relates to integrated circuits. More particularly, the subject matter relates to via leakage and breakdown testing.

BACKGROUND

An integrated circuit (IC) is a semiconductor device containing many small, interconnected components. These components function together to enable the IC to perform a task, such as control an electronic device, or perform logic operations. ICs are found in computers, cellular telephones, and many other electronic devices.

ICs and other semiconductor devices typically comprise multiple layers. The connections between the layers are known as vias. In integrated circuit design, a via is a small opening in an insulating oxide layer that allows a conductive connection between different layers of an IC. Multiple vias may be coupled together to connect one conductive region in an IC to another conductive region in the same or an adjacent IC.

Vias are subject to manufacturing errors. When a manufacturing error occurs in a via, the via may not conduct properly and thus may prohibit an IC from functioning correctly. Therefore, the testing of via structures is an important aspect of IC production and reliability.

Via related leakage and breakdown is one of the top issues for back end of the line (BEOL) process development and reliability. Traditional via testing structures such as via-comb (FIG. 1) and intertwined via chains (FIG. 2) are not capable of precisely diagnosing the root cause of a via related issue (in FIGS. 1 and 2, M1, M2 are metal layers, V1 are vias). For example, such structures are not capable of separately analyzing and differentiating between via leakage/breakdown problems occurring at the top of a via from via leakage/breakdown problems occurring at the bottom of a via. Such information is critical for process development, especially for self-aligned contact processes. In addition, such via testing structures are incapable of electrically identifying via overlay problems and cannot differentiate via-line versus line-line leakage and/or breakdown.

SUMMARY

A first aspect includes a testing structure, comprising: a first three terminal via testing structure, including: a first terminal coupled to a first set of sensing lines in a top level of the structure; a second terminal coupled to a second set of sensing lines in the top level of the structure, wherein first set of sensing lines and the second set of sensing lines are disposed in a comb arrangement; a third terminal coupled to a third set of sensing lines in a bottom level of the structure; and a plurality of vias electrically coupling the second set of sensing lines in the top level of the structure to the third set of sensing lines in the bottom level of the structure, each via having a via top and a via bottom.

A second aspect includes semiconductor wafer, comprising: a first three terminal via testing structure, including: a first terminal coupled to a first set of sensing lines in a top level of the structure; a second terminal coupled to a second set of sensing lines in the top level of the structure, wherein first set of sensing lines and the second set of sensing lines are disposed in a comb arrangement; a third terminal coupled to a third set of sensing lines in a bottom level of the structure; and a plurality of vias electrically coupling the second set of sensing lines in the top level of the structure to the third set of sensing lines in the bottom level of the structure, each via having a via top and a via bottom.

A third aspect includes a testing method, comprising: providing a three terminal via testing structure including at least one via; and isolating and obtaining via top measurement data at a top of the via and via bottom data at the bottom of the via using the three terminal via testing structure.

BRIEF DESCRIPTION OF THE DRAWINGS

These and other features of this invention will be more readily understood from the following detailed description of the various aspects of the invention taken in conjunction with the accompanying drawings that depict various embodiments of the invention.

DETAILED DESCRIPTION

As noted, the subject matter disclosed herein relates to integrated circuits. More particularly, the subject matter relates to via leakage and breakdown testing.

In embodiments, the via testing structures (hereafter "via testing structures") of the present disclosure may be located in the kerf regions surrounding the semiconductor dies on a semiconductor wafer. The kerf regions are areas where the semiconductor wafer will be cut to separate individual semiconductor dies when the fabrication process is complete. In other embodiments, the via testing structures may be located inside the semiconductor dies, as well. The via testing structures may be formed using semiconductor processing techniques on a semiconductor wafer.

Figure 3:
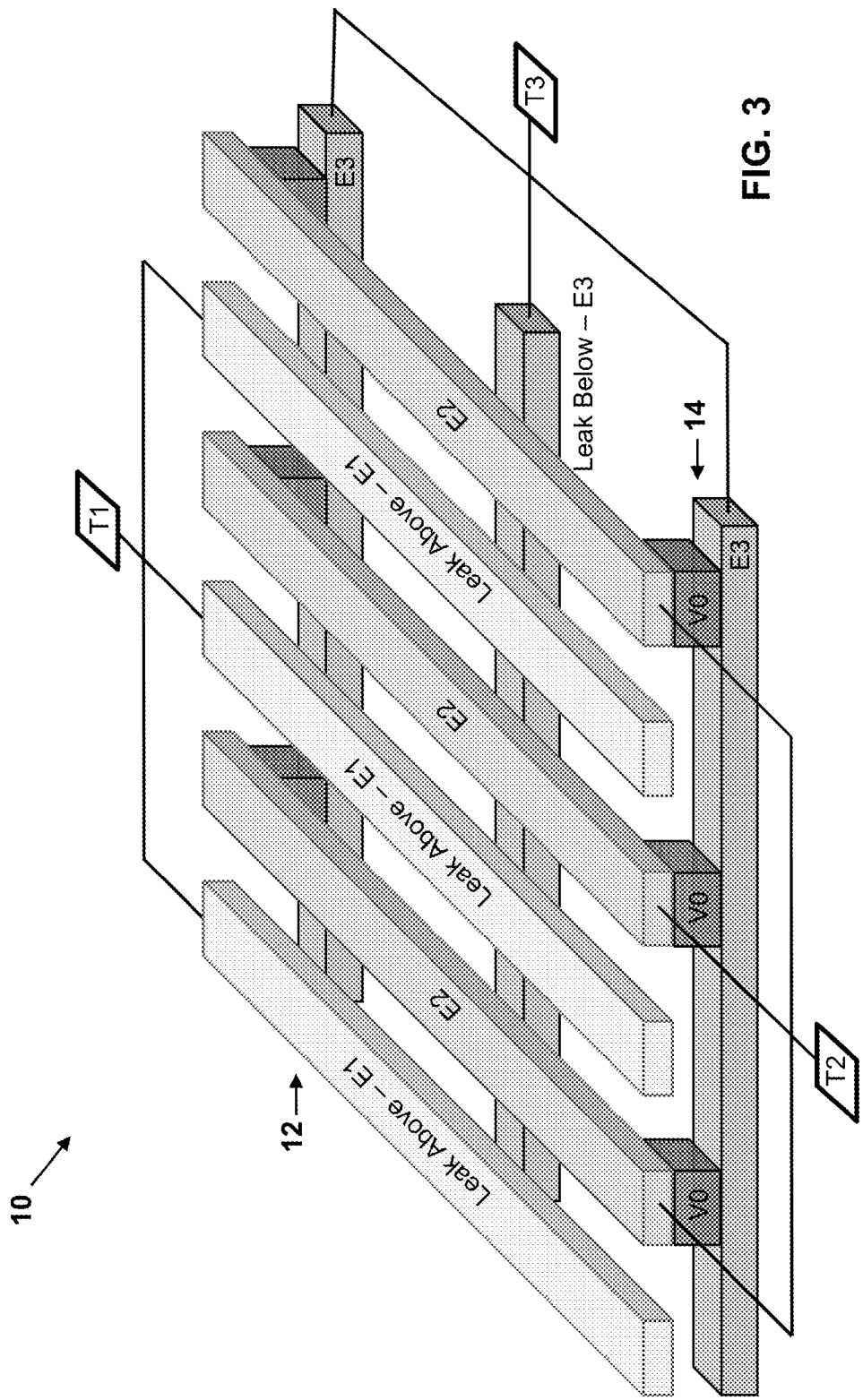
FIG. 3 depicts a three terminal via testing structure according to embodiments.

A three terminal via testing structure 10 according to embodiments is depicted in FIG. 3. The via testing structure 10 includes a plurality of electrically conducting (e.g., metal) sensing lines arranged in a plurality of levels (e.g., 2 levels) and a plurality of electrically conducting vias V0 connecting sensing lines in different levels together.

In the embodiment shown in FIG. 3, the via testing structure 10 includes an upper level 12 comprising a plurality of spaced apart and alternating sensing lines E1, E2. Each sensing line E1 is designated as a "Leak Above" sensing line. The sensing lines E1 in the upper level 12 of the via testing structure 10 are electrically coupled to a first terminal T1.

The via testing structure 10 further includes a lower level 14 comprising a plurality of spaced apart sensing lines E3. The sensing lines E3 are designated as "Leak Below" sensing lines. The sensing lines E2 in the upper level 12 of the via testing structure 10 are electrically coupled to the sensing lines E3 in the lower level 14 of the via testing structure 10 through vias V0. The sensing lines E2 are electrically coupled to a second terminal T2. The sensing lines E3 are electrically coupled to a third terminal T3. In embodiments, the sensing lines E1, E2 in the upper level 12 of the via testing structure 10 and the sensing lines E3 in the lower level 14 of the via testing structure 10 run perpendicularly to each other. As seen in FIG. 3, the sensing lines E1 connected to the first terminal T1 and the sensing lines E2 connected to the second terminal T2 are disposed in a comb arrangement (e.g., sensing lines E1 alternate with sensing lines E2).

Figures 1, 2:
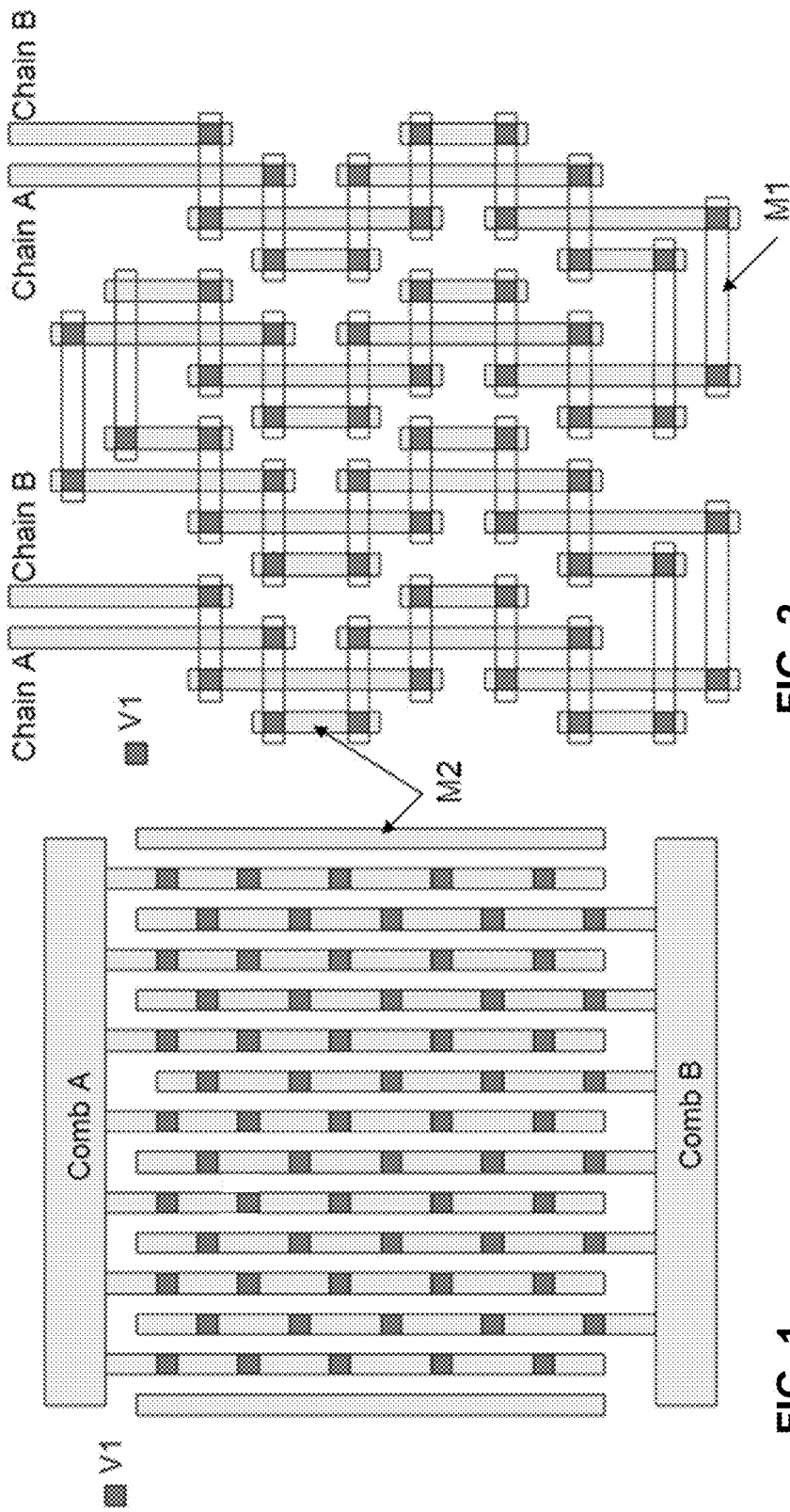
FIG. 1 depicts a related art via-comb testing structure.
FIG. 2 depicts a related art intertwined via chains testing structure.

Unlike conventional via testing structures, such as the via-comb testing structure shown in FIG. 1 and the intertwined via chains testing structure shown in FIG. 2, the via testing structure 10 of the present disclosure is capable of differentiating problems occurring at the top of a via (via-top) from problems occurring at the bottom of a via (via-bottom). Further, the via testing structure 10 can be used to differentiate via-line and line-line problems. The via testing structure 10 can also be used for the identification of via overlay problems.

Figures 4A, 4B:
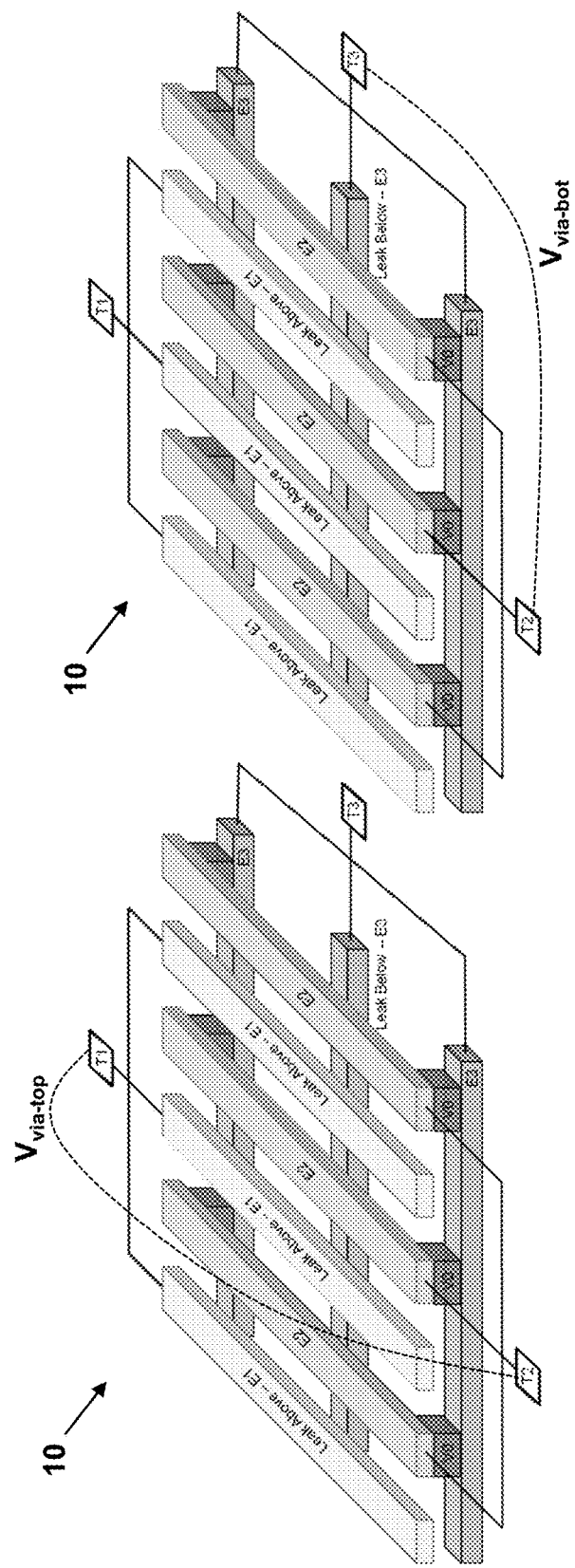
FIGS. 4A and 4B depict a pair of the via testing structure of FIG. 3 according to embodiments.

According to embodiments, as depicted in FIG. 4A, 4B, a plurality of cloned copies of the via testing structure 10 may be provided. As shown in FIG. 4A, via-top problems can be isolated and investigated by applying a voltage bias $V_{via-top}$ between sensing lines E1 and E2 through terminals T1 and T2, respectively, with terminal T3 remaining floating. Further, as shown in FIG. 4B, via-bottom problems can be isolated and investigated by applying a voltage bias $V_{via-bot}$ between sensing lines E2 and E3 through terminals T2 and T3, respectively, with terminal T1 remaining floating. The voltage biases $V_{via-top}$, $V_{via-bot}$ applied to via testing structures 10 in FIGS. 4A, 4B can be varied and various types of data (e.g., leakage current, breakdown voltage, etc.) can be collected and evaluated.

Figure 5:
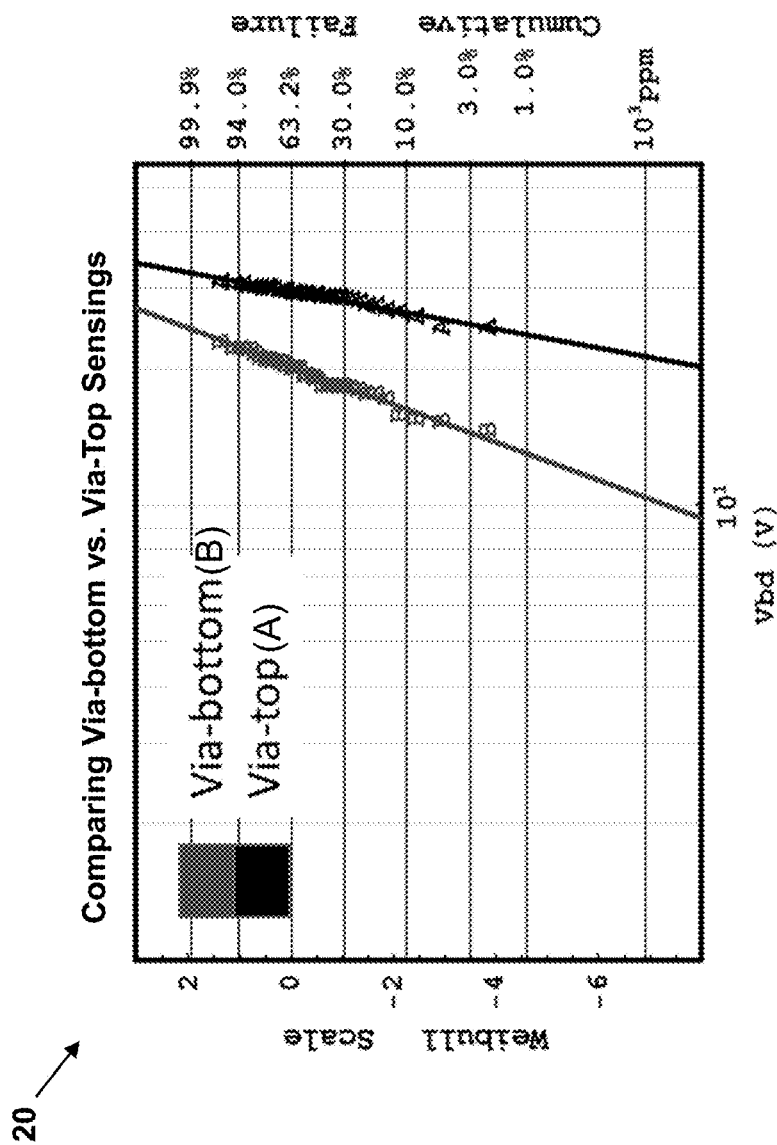
FIG. 5 is an illustrative chart comparing measurements at via-top versus via-bottom, obtained using the via testing structures shown in FIGS. 4A and 4B, respectively.

FIG. 5 depicts an illustrative chart 20 comparing via-top and via-bottom sensing data obtained using, for example, the via testing structures 10 shown in FIGS. 4A, 4B. In this example, it is clear that breakdown voltage issues at via-bottom are worse than at via-top. That is, the breakdown voltage measured at via-bottom is less than the breakdown voltage measured at via-top. Breakdown voltage can be determined, for example, by applying a voltage that is linearly increasing at a fixed rate. Leakage current is measured while ramping the voltage. The point at which there is an abrupt (e.g., sudden) increase in the leakage current is the breakdown voltage.

Figure 6:
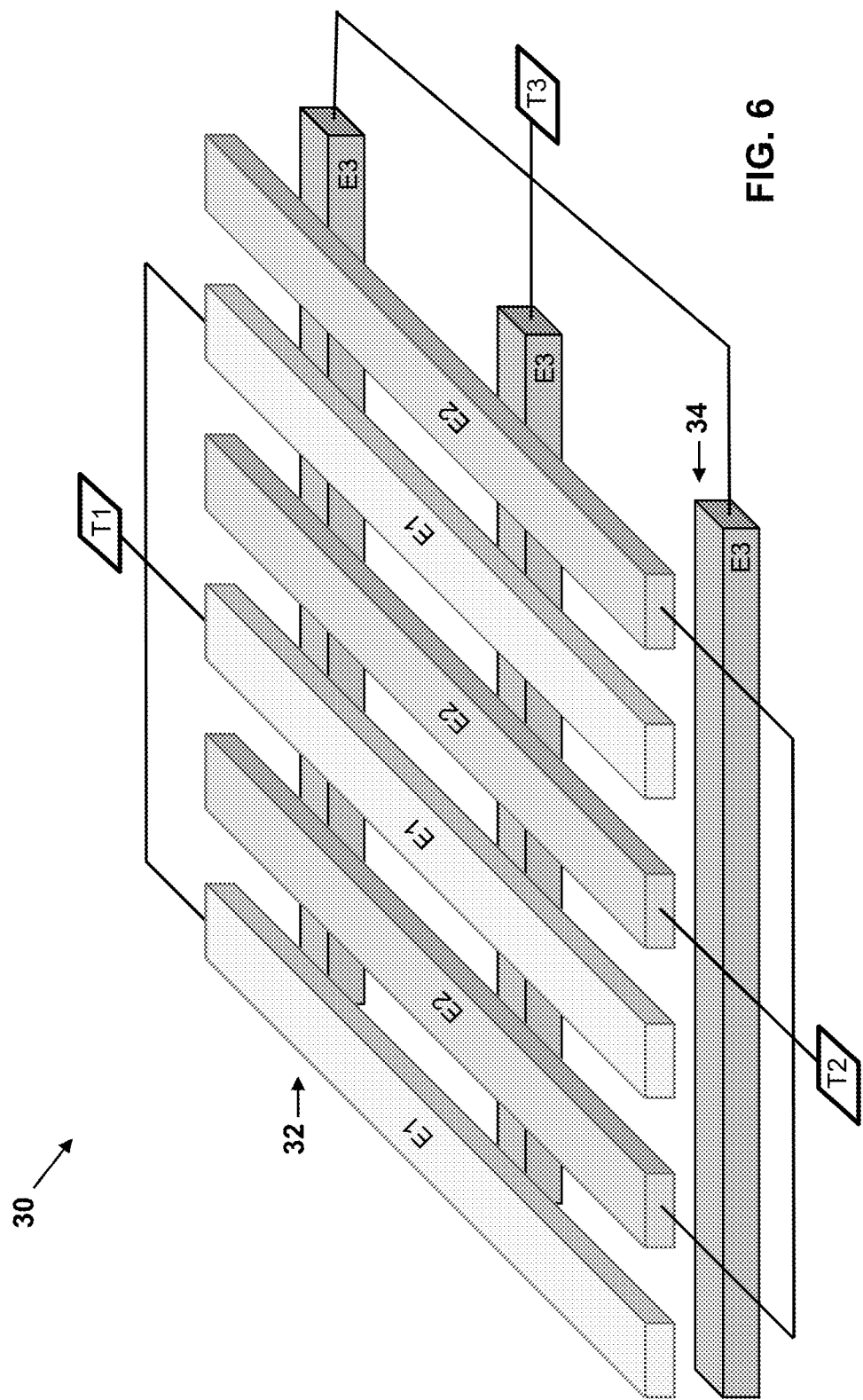
FIG. 6 depicts a three terminal testing structure for use in conjunction with the via testing structure of FIG. 3 according to embodiments.

Other data can be derived by employing a testing structure similar to that depicted in FIG. 3, but without the vias V0. For example, as shown in FIG. 6, a testing structure 30, which is substantially a clone of the via testing structure 10 of FIG. 3 (but without any vias V0), includes an upper level 32 comprising a plurality of spaced apart and alternating sensing lines E1, E2. The sensing lines E1 in the upper level 32 of the testing structure 30 are electrically coupled to a first terminal T1. The sensing lines E2 in the upper level 32 of the testing structure 30 are electrically coupled to a second terminal T2.

The testing structure 30 further includes a lower level 34 comprising a plurality of spaced apart sensing lines E3. Unlike in the via testing structure 10 depicted in FIG. 3, however, the sensing lines E2 in the upper level 32 of the testing structure 30 are not electrically coupled to the sensing lines E3 in the lower level 34 of the testing structure 30. In the testing structure 30, the sensing lines E3 are electrically coupled to a third terminal T3.

Figures 7A, 7B:
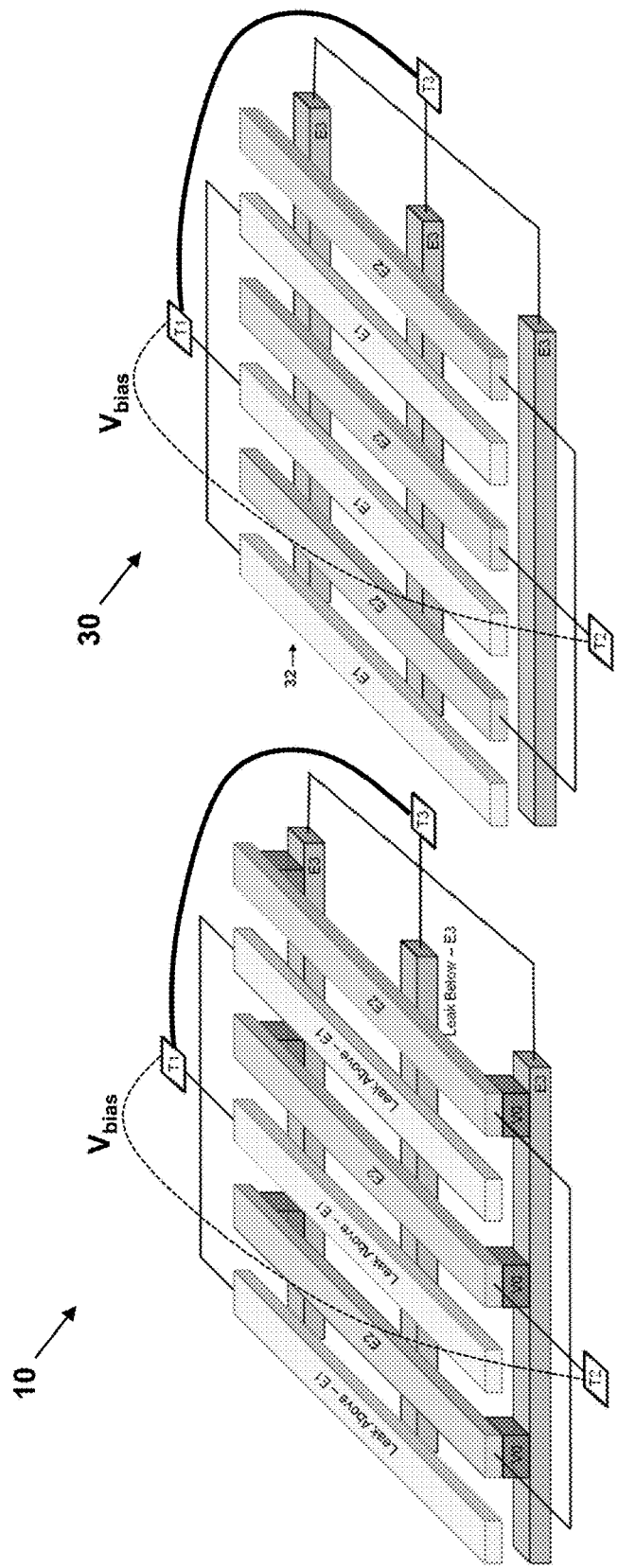
FIGS. 7A and 7B depict the via testing structure of FIG. 3 used together with the testing structure of FIG. 6 according to embodiments.

According to embodiments, via-line versus line-line problems can be examined by comparing the operation of the via testing structure 10 of FIG. 3 against the operation of the testing structure 30 of FIG. 6 under certain operational conditions. For example, as shown in FIGS. 7A and 7B, terminals T1 and T3 of each testing structure 10, 30 are tied together. A voltage bias $V_{bias}$ is applied between terminals (T1, T3) and T2 in both testing structures 10, 30. The voltage bias $V_{bias}$ applied to the testing structures 10, 30 in FIGS. 7A, 7B can be varied and various data (e.g., breakdown voltage data) can be collected and evaluated.

Figure 8:
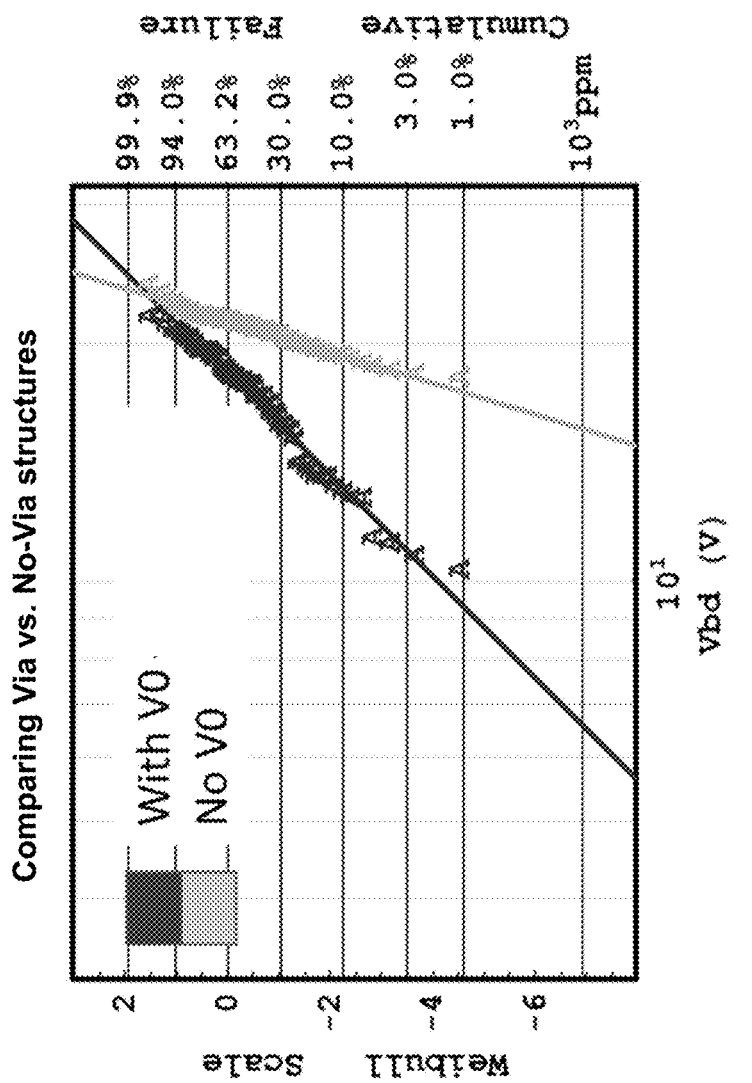
FIG. 8 is an illustrative chart comparing via versus no via sensing data collected using the testing structures shown in FIGS. 7A and 7B.

FIG. 8 depicts an illustrative chart comparing via versus no via sensing data collected using, for example, the testing structures 10, 30 shown in FIGS. 7A, 7B, respectively. In this example, it is clear that the vias V0 have a large impact on breakdown voltage and that bottom size control of the vias V0 is poor.

Figure 9:
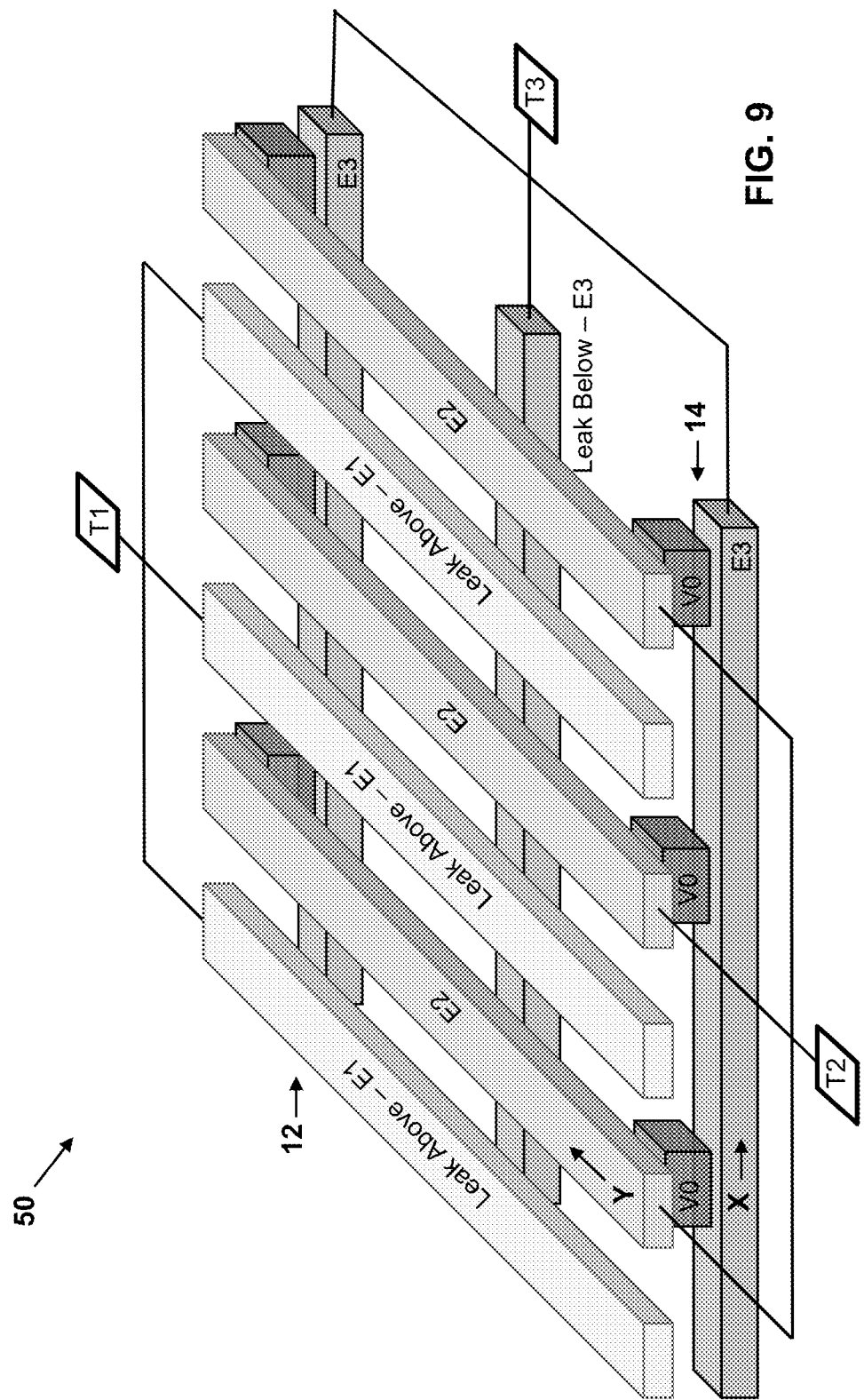
FIG. 9 depicts another three terminal via testing structure according to embodiments.
Figure 10:
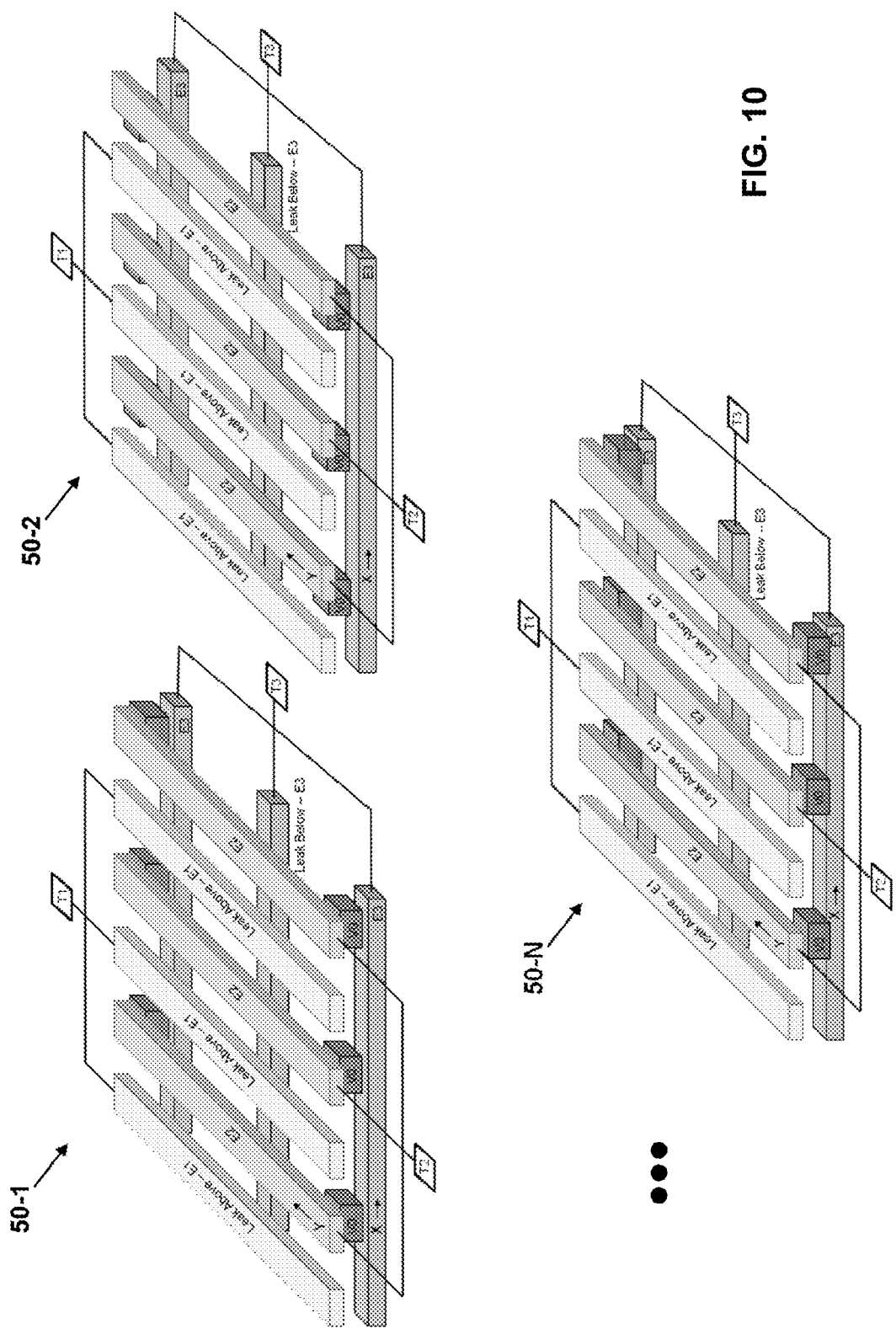
FIG. 10 depicts a plurality of the three terminal via testing structures of FIG. 9 according to embodiments.

FIG. 9 depicts another three terminal via testing structure 50 according to embodiments. The via testing structure 50 is similar to the via testing structure 10 shown in FIG. 3, except that the spacing between the vias V0 and neighboring lines (e.g., sensing lines E1) has been modulated by shifting the vias V0 a distance along the X and/or Y axis. As shown in FIG. 10, a plurality of these via testing structures 50-1, 50-2, ..., 50-N, each with different amounts of via V0 shifting along the X and/or Y axis, may be provided for testing purposes.

Figure 11B:
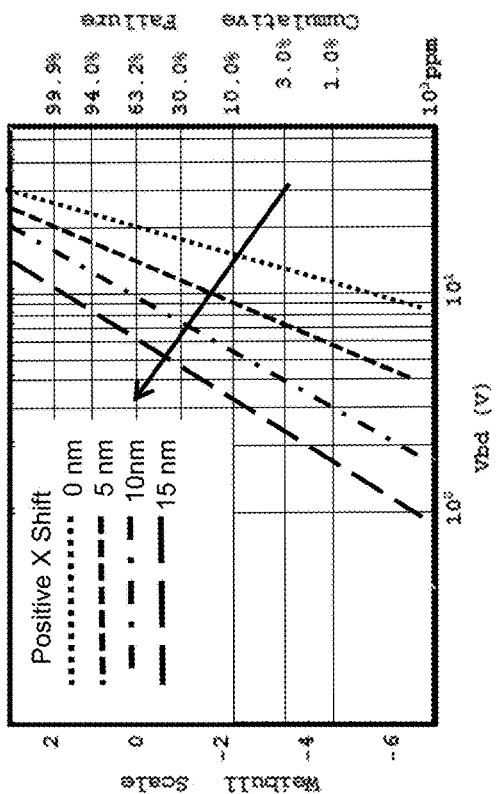
FIGS. 11A and 11B depict the effect of a positive X via shift and a negative X via shift, respectively, according to embodiments.
Figure 11A:
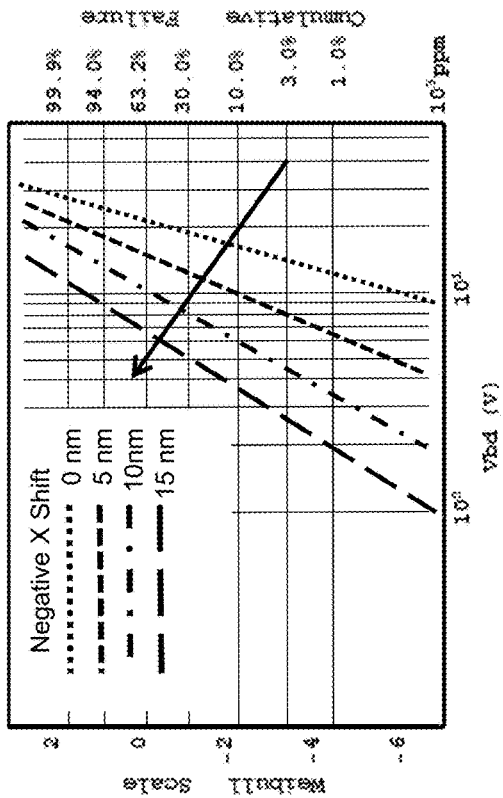

Using via testing structures 50, a wide variety of data can be quantitatively extracted and used to analyze, for example, overlay, via size, line width, via-line, and other issues. FIGS. 11A, 11B, for example, depict breakdown voltage effects due to a negative X shift and a positive X shift, respectively, with the arrow indicating increasing via V0 misalignment. As can be readily seen from FIGS. 11A, 11B, the breakdown voltage decreases as the amount of misalignment in the X direction increases.

Other information can be obtained by comparing breakdown voltage versus via V0 misalignment for a plurality of the via testing structures 50 having different via V0 misalignments. An illustrative chart depicting breakdown voltage versus misalignment is shown in FIG. 12.

Figure 12:
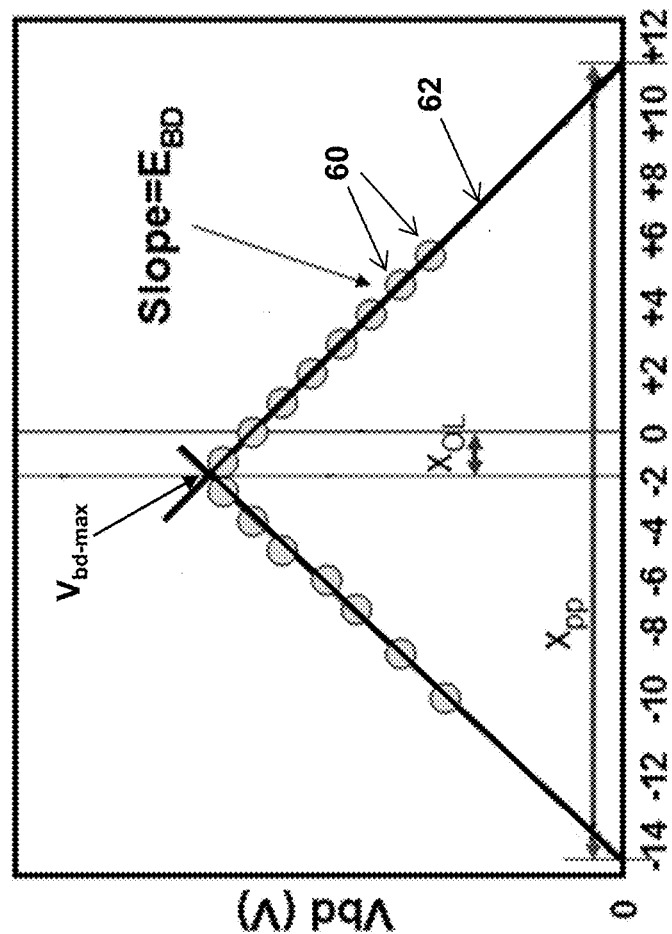
FIG. 12 is an illustrative chart of breakdown voltage measurements versus misalignment according to embodiments.

In FIG. 12, a plurality of breakdown voltage measurements 60 were made using a plurality of testing structures 50 having different via V0 misalignments in the X direction. As can be seen, the highest breakdown voltage $V_{bd-max}$ occurs when there is a −2 nm via misalignment. This indicates that a global overlay shift $X_{OL}$ of −2 nm is present after semiconductor wafer processing. Therefore, a −2 nm via misalignment structure may be used to bring back a +2 nm overlay shift to provide the most centered structure, with the highest breakdown voltage.

The actual spacing $X_{PP}$ between two lines can be extracted from the chart in FIG. 12 based on the total of the negative and positive misalignment distances that result in a zero breakdown voltage (i.e., the point where a via V0 would contact an adjacent line). The via-line spacing can be determined by subtracting the overlay shift $X_{OL}$ from the original design spacing. Further, as indicated in FIG. 12, the breakdown field strength $E_{BD}$ is given by the slope of the line 62.

Figure 13:
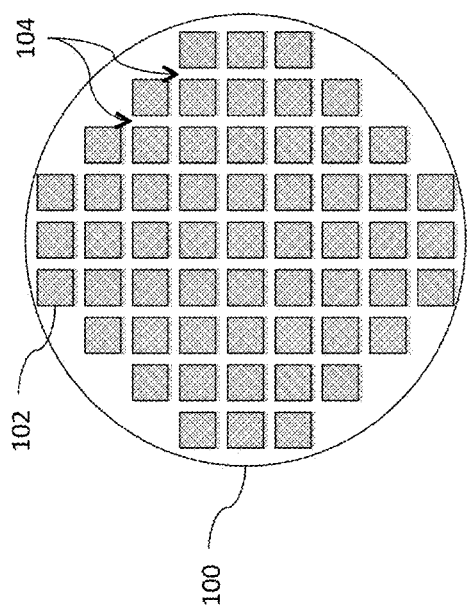
FIG. 13 is an illustrative semiconductor wafer including via testing structures according to embodiments.

FIG. 13 is a top-view schematic illustration showing a semiconductor wafer 100 that includes integrated circuit chips 102 and kerf areas 104 located between the integrated circuit chips 102. The via testing structures described above according to embodiments may be formed in the kerf areas 104.

Various exemplary embodiments of via test structures have been disclosed herein. However, those skilled in the art should understand that the number of components (e.g., sensing lines, vias, terminals, etc.) in such via testing structures are not limited to those depicted in the Figures.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A testing structure, comprising:
a first three terminal via testing structure, including:
 a first terminal coupled to a first set of sensing lines in a top level of the structure;
 a second terminal coupled to a second set of sensing lines in the top level of the structure, wherein first set of sensing lines and the second set of sensing lines are disposed in a comb arrangement;
 a third terminal coupled to a third set of sensing lines in a bottom level of the structure; and
 a plurality of vias electrically coupling the second set of sensing lines in the top level of the structure to the third set of sensing lines in the bottom level of the structure, each via having a via top and a via bottom.

2. The testing structure of claim 1, further comprising:
a voltage bias applied between the first terminal and the second terminal to isolate and obtain via top measurement data.

3. The testing structure of claim 1, further comprising:
a voltage bias applied between the second terminal and the third terminal to isolate and obtain via bottom measurement data.

4. The testing structure of claim 1, further comprising:
a second three terminal via testing structure, including:
 a first terminal coupled to a first set of sensing lines in a top level of the second three terminal via testing structure;
 a second terminal coupled to a second set of sensing lines in the top level of the second three terminal via testing structure, wherein first set of sensing lines and the second set of sensing lines are disposed in a comb arrangement; and
 a third terminal coupled to a third set of sensing lines in a bottom level of the second three terminal via testing structure.

5. The testing structure of claim 4, wherein the first and third terminals of the first three terminal via testing structure are tied together, and wherein the first and third terminals of the second three terminal via testing structure are tied together, further comprising:
a voltage bias applied between the first terminal and the second terminal of the first three terminal via testing structure, and a voltage bias applied between the first terminal and the second terminal of the second three terminal via testing structure.

6. The testing structure of claim 1, further comprising:
a plurality of the first three terminal via testing structures wherein, in each of the plurality of the first three terminal via testing structures, the vias are shifted a different distance along at least one axis.

7. The testing structure of claim 1, wherein the testing structure is located in a kerf area of a semiconductor wafer.

8. A semiconductor wafer, comprising:
a first three terminal via testing structure, including:
a first terminal coupled to a first set of sensing lines in a top level of the structure;
a second terminal coupled to a second set of sensing lines in the top level of the structure, wherein first set of sensing lines and the second set of sensing lines are disposed in a comb arrangement;
a third terminal coupled to a third set of sensing lines in a bottom level of the structure; and
a plurality of vias electrically coupling the second set of sensing lines in the top level of the structure to the third set of sensing lines in the bottom level of the structure, each via having a via top and a via bottom.

9. The semiconductor wafer of claim 8, further comprising:
a voltage bias applied between the first terminal and the second terminal to isolate and obtain via top measurement data.

10. The semiconductor wafer of claim 8, further comprising:
a voltage bias applied between the second terminal and the third terminal to isolate and obtain via bottom measurement data.

11. The semiconductor wafer of claim 8, further comprising:
a second three terminal via testing structure, including:
a first terminal coupled to a first set of sensing lines in a top level of the second three terminal via testing structure;
a second terminal coupled to a second set of sensing lines in the top level of the second three terminal via testing structure, wherein first set of sensing lines and the second set of sensing lines are disposed in a comb arrangement; and
a third terminal coupled to a third set of sensing lines in a bottom level of the second three terminal via testing structure.

12. The semiconductor wafer of claim 11, wherein the first and third terminals of the first three terminal via testing structure are tied together, and wherein the first and third terminals of the second three terminal via testing structure are tied together, further comprising:
a voltage bias applied between the first terminal and the second terminal of the first three terminal via testing structure, and a voltage bias applied between the first terminal and the second terminal of the second three terminal via testing structure.

13. The semiconductor wafer of claim 8, further comprising:
a plurality of the first three terminal via testing structures wherein, in each of the plurality of the first three terminal via testing structures, the vias are shifted a different distance along at least one axis.

14. The semiconductor wafer of claim 8, wherein the testing structure is located in a kerf area of the semiconductor wafer.

15. A testing method, comprising:
providing a three terminal via testing structure including at least one via, the three terminal via testing structure including:
a first terminal coupled to a first set of sensing lines in a top level of the structure;
a second terminal coupled to a second set of sensing lines in the top level of the structure, wherein first set of sensing lines and the second set of sensing lines are disposed in a comb arrangement;
a third terminal coupled to a third set of sensing lines in a bottom level of the structure; and
the at least one via electrically coupling at least one sensing line in the second set of sensing lines in the top level of the structure to at least one line in the third set of sensing lines in the bottom level of the structure, each via having a via top and a via bottom; and
isolating and obtaining via top measurement data at a top of the via and via bottom data at the bottom of the via using the three terminal via testing structure.

16. The testing method of claim 15, wherein the measurement data comprises voltage breakdown data.

17. The testing method of claim 15, further comprising:
applying a voltage bias between the first terminal and the second terminal to isolate and obtain the via top measurement data.

18. The testing method of claim 15, further comprising:
applying a voltage bias applied between the second terminal and the third terminal to isolate and obtain the via bottom measurement data.

* * * * *